(12) United States Patent
Lo et al.

(10) Patent No.: US 12,349,305 B2
(45) Date of Patent: Jul. 1, 2025

(54) HARD DISK TRAY CONDUCIVE TO AUTOMATED PRODUCTIONS

(71) Applicant: CHENBRO MICOM CO., LTD., New Taipei (TW)

(72) Inventors: Syu-Kuan Lo, New Taipei (TW); Chun-Hung Ssu, New Taipei (TW); Hsin-Lin Teng, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 251 days.

(21) Appl. No.: 18/346,872

(22) Filed: Jul. 5, 2023

(65) Prior Publication Data

US 2024/0397657 A1 Nov. 28, 2024

(30) Foreign Application Priority Data

May 26, 2023 (TW) .................................. 112119782

(51) Int. Cl.
| | | |
|---|---|---|
| *G06F 1/18* | (2006.01) | |
| *H05K 5/02* | (2006.01) | |
| *H05K 7/14* | (2006.01) | |
| *H05K 9/00* | (2006.01) | |

(52) U.S. Cl.
CPC ........... *H05K 7/1489* (2013.01); *G06F 1/187* (2013.01); *H05K 5/023* (2013.01); *H05K 7/1405* (2013.01); *H05K 9/002* (2013.01)

(58) Field of Classification Search
CPC .................................................... G06F 1/187
See application file for complete search history.

(56) References Cited

U.S. PATENT DOCUMENTS

| | | | | |
|---|---|---|---|---|
| 6,166,900 | A * | 12/2000 | Flynn ...................... | G11B 33/08 |
| 6,421,236 | B1 * | 7/2002 | Montoya .............. | H05K 9/0016 |
| 6,798,650 | B2 * | 9/2004 | Reznikov ............. | G11B 33/122 |
| | | | | D14/363 |
| 7,092,250 | B2 * | 8/2006 | Chen .................... | H05K 7/1487 |
| | | | | 361/825 |
| 10,593,371 | B2 * | 3/2020 | Hu .......................... | G06F 1/187 |
| 2008/0180901 | A1 * | 7/2008 | Yang ....................... | G06F 1/187 |

(Continued)

FOREIGN PATENT DOCUMENTS

| | | |
|---|---|---|
| TW | M250282 U | 11/2004 |
| TW | 201408176 A | 2/2014 |
| TW | I556229 B | 11/2016 |

(Continued)

*Primary Examiner* — Adrian S Wilson
(74) *Attorney, Agent, or Firm* — CKC & Partners Co., LLC

(57) ABSTRACT

A hard disk tray conducive to automated productions includes a loading frame, a base frame, an abutment member disposed within the base frame, a handle and a buckle. The loading frame includes a first frame body for loading a hard disk device therein. The base frame includes a base body connected to the first frame body, and an abutting elastic arm integrated to the base body. The handle includes a bracket pivoted to the base body, a first elastic arm integrated to the bracket to abut against the abutting elastic arm, and a first fastening portion disposed on the bracket. The buckle includes a buckle body pivoted to the base body, a second elastic arm integrated to the buckle body to abut against the abutment member, and a second fastening portion disposed on the buckle body for fastening to the first fastening portion.

20 Claims, 12 Drawing Sheets

(56) References Cited

U.S. PATENT DOCUMENTS

2011/0013352 A1* 1/2011 Chuang ................ G11B 33/124
361/679.01

FOREIGN PATENT DOCUMENTS

| TW | M543447 U | 6/2017 |
|----|-----------|--------|
| TW | I626649 B | 6/2018 |
| TW | 201927112 A | 7/2019 |
| TW | I674575 B | 10/2019 |
| TW | I761055 B | 4/2022 |

* cited by examiner

HARD DISK TRAY CONDUCIVE TO AUTOMATED PRODUCTIONS

RELATED APPLICATIONS

This application claims priority to Taiwan Application Serial Number 112119782, filed on May 26, 2023, which is herein incorporated by reference in its entirety.

BACKGROUND

Field of Disclosure

The present disclosure relates to a hard disk tray. More particularly, the present disclosure relates to a hard disk tray conducive to automated productions.

Description of Related Art

Generally, in order to shorten delivery time and reduce production costs, manufacturers need to introduce automation equipment of the production line (i.e., robots or robot arms etc.) to replace manual work in the production process. For example, the automation equipment of the production line is introduced into the assembly process of hard disk trays.

However, due to the shape design of some components of each of the hard disk trays, these components are not suitable for being grasped by a robot arm, deformed by exerting force, so as to be finally assembled as a hard disk tray. It must be completed by a human assembler or an advanced robot. In this way, the goal of a fully automated production line cannot be fulfilled.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide a hard disk tray conducive to automated productions for solving the difficulties mentioned above in the prior art.

In one embodiment of the present disclosure, a hard disk tray conducive to automated productions is provided, and the hard disk tray includes a loading frame, a base frame, an abutment member, a handle and a buckle. The loading frame includes a first frame body that is formed with a loading space for loading a hard disk device therein. The base frame includes a base body connected to the first frame body, and an abutting elastic arm integrally connected to the base body. The abutment member is disposed within the base body. The handle includes a bracket pivotally connected to the base body, a first elastic arm integrally connected to the bracket to abut against the abutting elastic arm, and a first fastening portion disposed on the bracket. The buckle includes a buckle body pivotally connected to the base body and arranged opposite to the handle, a second elastic arm integrally connected to the buckle body to abut against the abutment member, and a second fastening portion disposed on the buckle body for fastening to the first fastening portion.

According to one or more embodiments of the present disclosure, in the hard disk tray, the loading frame further includes a plurality of openings, a second frame body, at least one assembly hole, a fixing member and a plurality of positioning bumps. The openings are respectively arranged on two opposite sides of the first frame body. The second frame body is formed with a receiving space for receiving the first frame body, the second frame body sleeved to outer sides of the first frame body facing away from the receiving space, disposed between the first frame body and the base body and integrally connected to the abutment member. The assembly hole is formed on one side of the second frame body. The fixing member is detachably received within the assembly hole, and extends into the loading space from the assembly hole. The positioning bumps are respectively arranged on two opposite inner surfaces of the second frame body facing towards the receiving space, and respectively extend into the loading space through some of the openings. The fixing member and the positioning bumps collectively hold the hard disk device within the loading space.

According to one or more embodiments of the present disclosure, in the hard disk tray, the first frame body includes a front component and a rear component. The front component includes two lateral plates and an EMI frame. The EMI frame is connected to the lateral plates and sandwiched between the second frame body and the base frame. The rear component is opposite to the EMI frame, and fixedly connected to the lateral plates.

According to one or more embodiments of the present disclosure, in the hard disk tray, the lateral plates of the front component have different heights.

According to one or more embodiments of the present disclosure, in the hard disk tray, the base frame further includes at least one first hook portion and at least one second hook portion. The first hook portion is disposed on the base body and detachably coupled to the first frame body. The second hook portion is disposed on the base body and detachably coupled to the second frame body.

According to one or more embodiments of the present disclosure, in the hard disk tray, the assembly hole includes a through hole, at least one inlet portion and at least one arc groove. The through hole and the inlet portion commonly penetrate through the second frame body, and the arc groove is concavely formed on one of the opposite inner surfaces of the second frame body and connected to the inlet portion. The fixing member includes a fixing body, at least one protrusive rib and at least one protrusive pole. The protrusive pole is disposed on a front surface of the fixing body and extends to the hard disk device in the loading space through the assembly hole, and the protrusive rib is located on one side surface of the fixing body and is used to be rotated into the arc groove from the inlet portion, so that the fixing member is able to be positioned between the second frame body and the first frame body.

According to one or more embodiments of the present disclosure, the hard disk tray further includes a light guide element. The light guide element is formed with at least one light outputting portion at one distal end thereon. The base frame is formed with at least one penetrating channel penetrating through the base body. One part of the light guide element is located on one of an outer surface and an inner side of the second frame body, and another part of the light guide element is in the penetrating channel, and the light outputting portion of the light guide element extends outwardly from a surface of the base frame through the penetrating channel.

According to one or more embodiments of the present disclosure, in the hard disk tray, the light outputting portion includes a plurality of the light outputting portions spaced apart from one another, and the light outputting portions have different areas.

According to one or more embodiments of the present disclosure, in the hard disk tray, the base frame includes a hollow passage. The first frame body is provided with a first mesh structure, and the second frame body is provided with a second mesh structure sandwiched between the hollow passage and the first mesh structure. The hollow passage is in communication with the loading space through the second mesh structure and the first mesh structure.

According to one or more embodiments of the present disclosure, in the hard disk tray, the first mesh structure is formed with a plurality of first mesh holes which are evenly distributed thereon, and each of the first mesh holes is in one of a geometric shape and an elongated shape. The second mesh structure is formed with a plurality of second mesh holes which are evenly distributed thereon, and a shape of each of the second mesh holes is the same as a shape of each of the first mesh holes.

According to one or more embodiments of the present disclosure, in the hard disk tray, one side of the bracket facing away from the loading frame is provided with a front-end portion, an upper guiding slope surface and a lower guiding slope surface, the upper guiding slope surface and the lower guiding slope surface are respectively connected to two opposite sides of the front-end portion, and gradually extend away from each other in a direction facing away from the front-end portion. When the bracket is placed in the hollow passage, the bracket and inner walls of the hollow passage respectively define an upper gap and a lower gap, and the upper guiding slope surface and the lower guiding slope surface are used to guide incoming air flows to two opposite surfaces of the hard disk device through the upper gap and the lower gap.

In one embodiment of the present disclosure, a hard disk tray conducive to automated productions is provided, and the hard disk tray includes a loading frame, a base frame, a handle and a buckle. The loading frame includes a first frame body and an abutment member. The first frame body is formed with a loading space for loading a hard disk device therein. The abutment member is connected to the first frame body, and two opposite sides of the first frame body have different heights, respectively. The base frame includes a base body connected to the first frame body, and an abutting elastic arm integrally connected to the base body. The handle includes a bracket pivotally connected to the base body, a first elastic arm integrally connected to the bracket to abut against the abutting elastic arm, and a first fastening portion disposed on the bracket. The buckle includes a buckle body, a second elastic arm and a second fastening portion. The buckle body pivotally connected to the base body and arranged opposite to the handle, a second elastic arm integrally connected to the buckle body to abut against the abutment member, and a second fastening portion disposed on the buckle body for fastening to the first fastening portion.

According to one or more embodiments of the present disclosure, in the hard disk tray, the loading frame further includes a plurality of openings, a second frame body, at least one assembly hole, a fixing member and a plurality of positioning bumps. The openings are respectively arranged on the opposite sides of the first frame body. The second frame body is formed with a receiving space for receiving the first frame body. The second frame body is sleeved to outer sides of the first frame body facing away from the receiving space, disposed between the first frame body and the base body and integrally connected to the abutment member. The abutment member is integrally protruded on the second frame body. The assembly hole is formed on one side of the second frame body. The fixing member is detachably received within the assembly hole, and extends into the loading space from the assembly hole. The positioning bumps are respectively arranged on two opposite inner surfaces of the second frame body facing towards the receiving space, and respectively extend into the loading space through some of the openings. The fixing member and the positioning bumps collectively hold the hard disk device within the loading space.

According to one or more embodiments of the present disclosure, in the hard disk tray, the first frame body includes a front component and a rear component. The front component includes two lateral plates and an EMI frame. The EMI frame is connected to the lateral plates and sandwiched between the second frame body and the base frame. The rear component is opposite to the EMI frame, and fixedly connected to the lateral plates.

According to one or more embodiments of the present disclosure, in the hard disk tray, the base frame further includes at least one first hook portion and at least one second hook portion. The first hook portion is disposed on the base body and detachably coupled to the first frame body. The second hook portion is disposed on the base body and detachably coupled to the second frame body.

According to one or more embodiments of the present disclosure, in the hard disk tray, the assembly hole includes a through hole, at least one inlet portion and at least one arc groove. The through hole and the inlet portion commonly penetrate through the second frame body, the arc groove is concavely formed on one of the opposite inner surfaces of the second frame body and connected to the inlet portion. The fixing member includes a fixing body, at least one protrusive rib and at least one protrusive pole. The protrusive pole is disposed on a front surface of the fixing body and extends to the hard disk device within the loading space through the assembly hole. The protrusive rib is located on one side surface of the fixing body and used to be rotated into the arc groove from the inlet portion, so that the fixing member is able to be positioned between the second frame body and the first frame body.

According to one or more embodiments of the present disclosure, the hard disk tray further includes a light guide element. The light guide element is formed with at least one light outputting portion at one distal end thereon. The base frame is formed with at least one penetrating channel penetrating through the base body. One part of the light guide element is located on one of an outer surface and an inner side of the second frame body, and another part of the light guide element is in the penetrating channel, and the light outputting portion of the light guide element extends outwardly from a surface of the base frame through the penetrating channel.

According to one or more embodiments of the present disclosure, in the hard disk tray, the light outputting portion includes a plurality of the light outputting portions spaced apart from one another, and the light outputting portions have different areas.

According to one or more embodiments of the present disclosure, in the hard disk tray, the base frame includes a hollow passage. The first frame body is provided with a first mesh structure, and the second frame body is provided with a second mesh structure sandwiched between the hollow passage and the first mesh structure. The hollow passage is in communication with the loading space through the second mesh structure and the first mesh structure. The first mesh structure is formed with a plurality of first mesh holes which are evenly distributed thereon, and each of the first mesh holes is in one of a geometric shape and an elongated shape and the second mesh structure is formed with a plurality of second mesh holes which are evenly distributed thereon. A shape of each of the second mesh holes is the same as a shape of each of the first mesh holes.

According to one or more embodiments of the present disclosure, in the hard disk tray, one side of the bracket facing away from the loading frame is provided with a front-end portion, an upper guiding slope surface and a lower guiding slope surface, the upper guiding slope surface and the lower guiding slope surface are respectively connected to two opposite sides of the front-end portion, and gradually extend away from each other in a direction facing away from the front-end portion. When the bracket is placed in the hollow passage, the bracket and inner walls of the hollow passage respectively define an upper gap and a lower gap, and the upper guiding slope surface and the lower guiding slope surface are used to guide incoming air flows to two opposite surfaces of the hard disk device through the upper gap and the lower gap.

Thus, through the construction of the embodiments above, these components mentioned above of the hard disk tray in the disclosure are able to be grasped by a robot arm, deformed by exerting force, so as to be finally assembled as the hard disk tray mentioned above, and not necessary to be done manually. Thus, it is beneficial to fulfill the goal of a fully automated production line.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
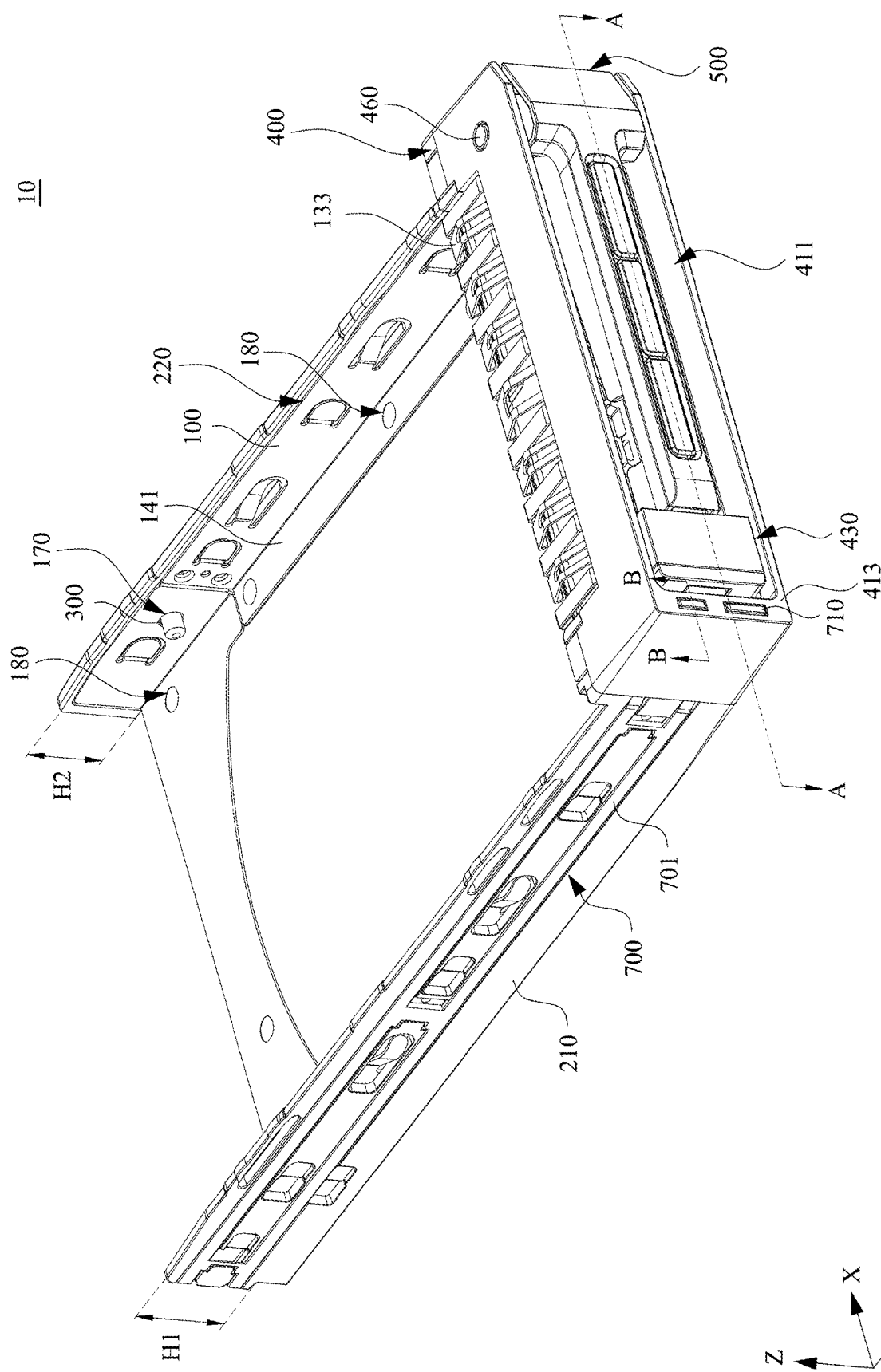
FIG. 1 is a perspective view of a hard disk tray conducive to automated productions according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
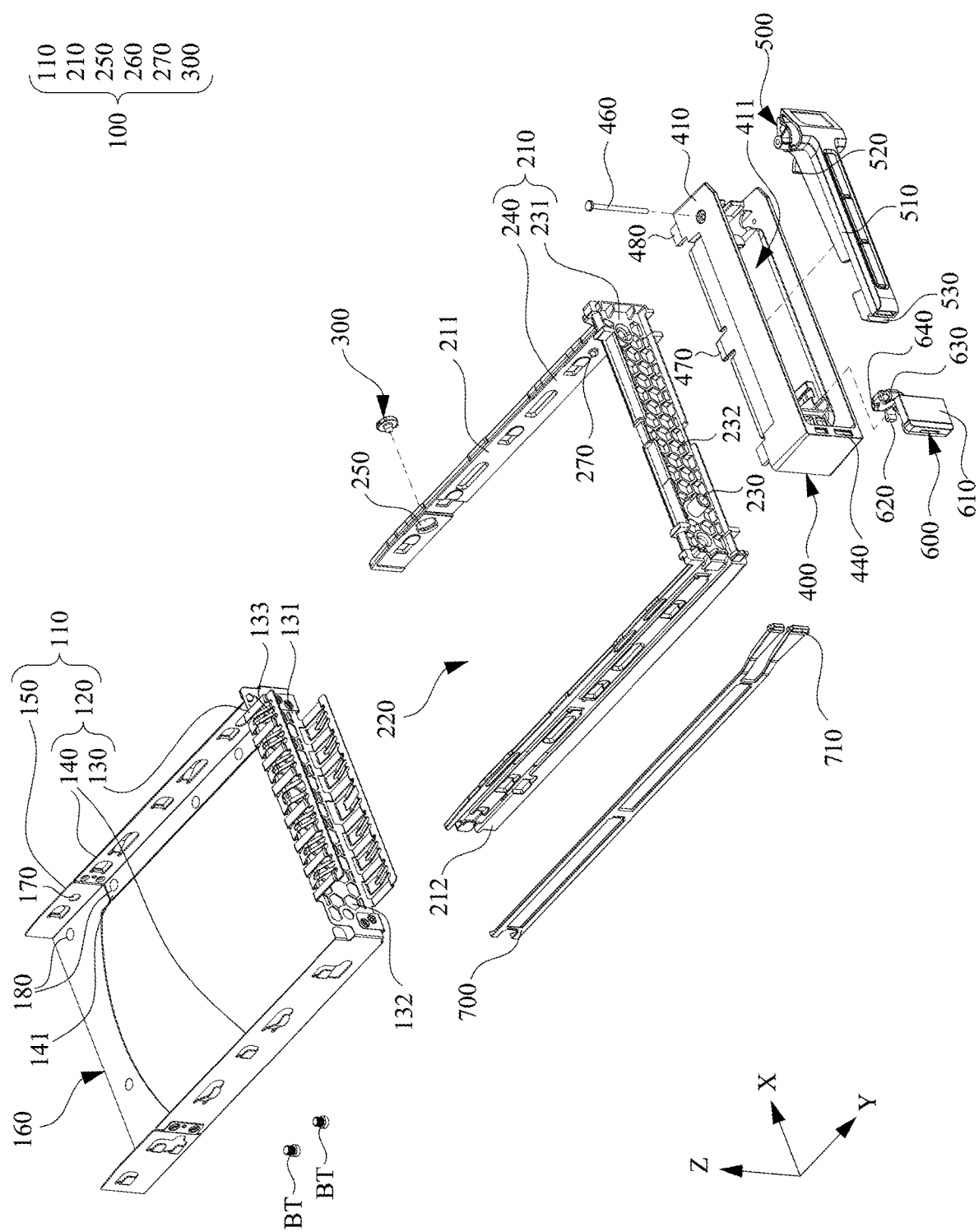
FIG. 2 is a disassembled view of the hard disk tray in FIG. 1.
Figure 3:
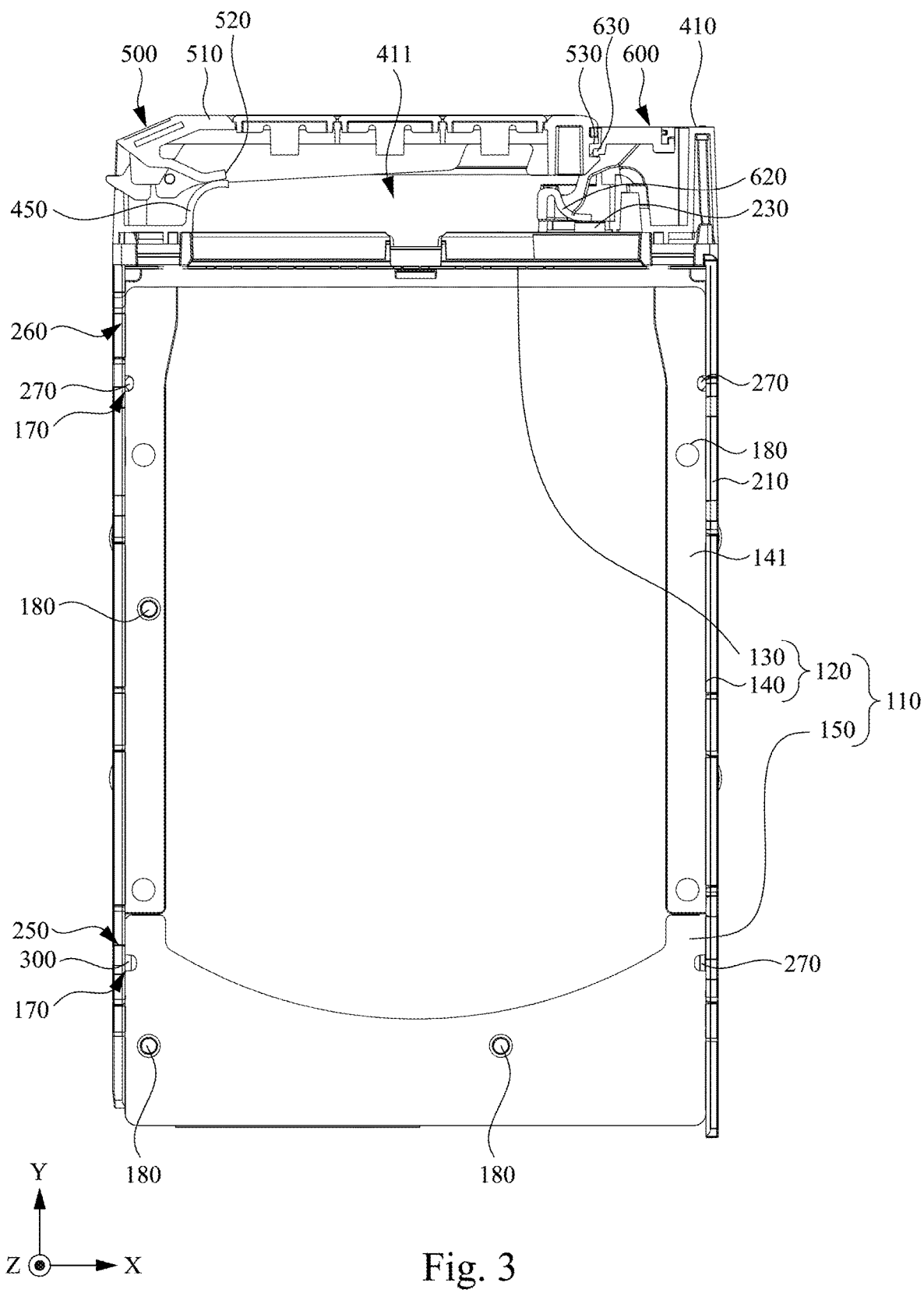
FIG. 3 is a cross-sectional view of the hard disk tray viewed along a line AA of FIG. 1.

Reference is now made to FIG. 1 to FIG. 3, in which FIG. 1 is a perspective view of a hard disk tray 10 conducive to automated productions according to one embodiment of the present disclosure. FIG. 2 is a disassembled view of the hard disk tray 10 in FIG. 1. FIG. 3 is a cross-sectional view of the hard disk tray 10 viewed along a line AA of FIG. 1. As shown in FIG. 1 to FIG. 3, in this embodiment, the hard disk tray 10 includes a loading frame 100, a base frame 400, a handle 500 and a buckle 600. The loading frame 100 includes a first frame body 110 and a plurality (e.g., five) of first openings 170. The first frame body 110 is in an U shape, and one side of the first frame body 110 is concavely formed with a loading space 160. The first openings 170 are respectively arranged on two opposite sides of the first frame body 110, and respectively in communication with the loading space 160. For example, two first openings and three first openings are respectively formed on the opposite sides of the first frame body 110. Moreover, the shapes and sizes of the first openings 170 are different. The base frame 400 includes a base body 410 and an abutting elastic arm 450. The base body 410 is connected to one side of the first frame body 110, and the base frame 400 includes a hollow passage 411 penetrating through the base body 410. In the embodiment, the abutting elastic arm 450 is disposed within the hollow passage 411 and integrally connected to the base body 410. The abutting elastic arm 450 is, for example in a hook type. However, the disclosure is not limited thereto. For example, the first frame body 110 is a metal frame.

The loading frame 100 further includes a second frame body 210. The second frame body 210 is in an U shape, and one side of the second frame body 210 is formed with a receiving space 220 for receiving the first frame body 110. One side of the second frame body 210 is provided with an abutment member 230. The abutment member 230 extends into the hollow passage 411 from the second frame body 210, and is opposite to the abutting elastic arm 450. In the embodiment, the abutment member 230 is integrally formed on the second frame body 210, and the abutment member 230 is, for example, a protrusion column (FIG. 3). However, the disclosure is not limited to the shape and position of the abutment member 230. In other embodiments, when the second frame body 210 is omitted, the abutment member 230 may also be located on the first frame body 110 or the base frame 400.

As shown in FIG. 3, the handle 500 includes a bracket 510, a first elastic arm 520 and a first fastening portion 530. The first fastening portion 530 is arranged opposite to the first elastic arm 520. The first fastening portion 530 is integrally formed on one end of the bracket 510. One end of the first elastic arm 520 is integrally connected to the bracket 510, and the other end of the first elastic arm 520 is abutted to the abutting elastic arm 450. In this embodiment, the first elastic arm 520 is, for example in an arc-shape, and can preload the abutting elastic arm 450 so that both of the abutting elastic arm 450 and the first elastic arm 520 maintain a certain amount of deformation, that is, the abutting elastic arm 450 and the first elastic arm 520 are pushed against to each other so that the abutting elastic arm 450 and the first elastic arm 520 are temporarily bended in a force balance state, however, the disclosure is not limited thereto. The bracket 510 is pivotally connected to the base body 410. For example, the bracket 510 is pivotally disposed inside the hollow passage 411 of the base body 410 through a pivot 460 so that the bracket 510 can be relatively rotated into or outwards from the hollow passage 411. However, the disclosure is not limited thereto. In other embodiment, the pivot 460 may also be modified to be integrated with the bracket 510 as a pivot design. The buckle 600 includes a buckle body 610, a second elastic arm 620 and a second fastening portion 630. The buckle body 610 is pivotally connected to the base body 410 and arranged opposite to the handle 500. In the embodiment, the buckle body 610 is pivotally disposed inside the hollow passage 411 through an one-piece pivot 640 so that the buckle 600 can be relatively rotated about a shaft axis (e.g., Z axis) of the one-piece pivot 640 in the hollow passage 411. One end of the second elastic arm 620 is integrally connected to the buckle body 610, and the other end of the second elastic arm 620 abuts against the abutment member 230, so that the abutment member 230 can preload the second elastic arm 620 so that both of the abutment member 230 and the second elastic arm 620 maintain a certain amount of deformation in order to bring the buckle 600 back to its original position later. The second fastening portion 630 is integrally formed on the buckle body 610, and complementary to the shape of the first fastening portion 530, so as to be fastened with the first fastening portion 530, however, the disclosure is not limited thereto.

Therefore, when the hard disk tray 10 is moved into a server chassis (not shown in figures), and the bracket 510 is rotated into the hollow passage 411 to reach the buckle 600 (FIG. 3), the bracket 510 is movable with the first elastic arm 520, so that the first elastic arm 520 which has been deformed is pressed against and curved inwardly by the abutting elastic arm 450 in the hollow passage 411, so as to allow the deformed first elastic arm 520 and the deformed abutting elastic arm 450 to store a first restoring elastic force, respectively. At this moment, the buckle 600 allows the second fastening portion 630 to be fastened and retained by the first fastening portion 530, so as to prevent the first elastic arm 520 to move the bracket 510 to be rotated away from the buckle 600 outwards from the hollow passage 411.

Figure 4:
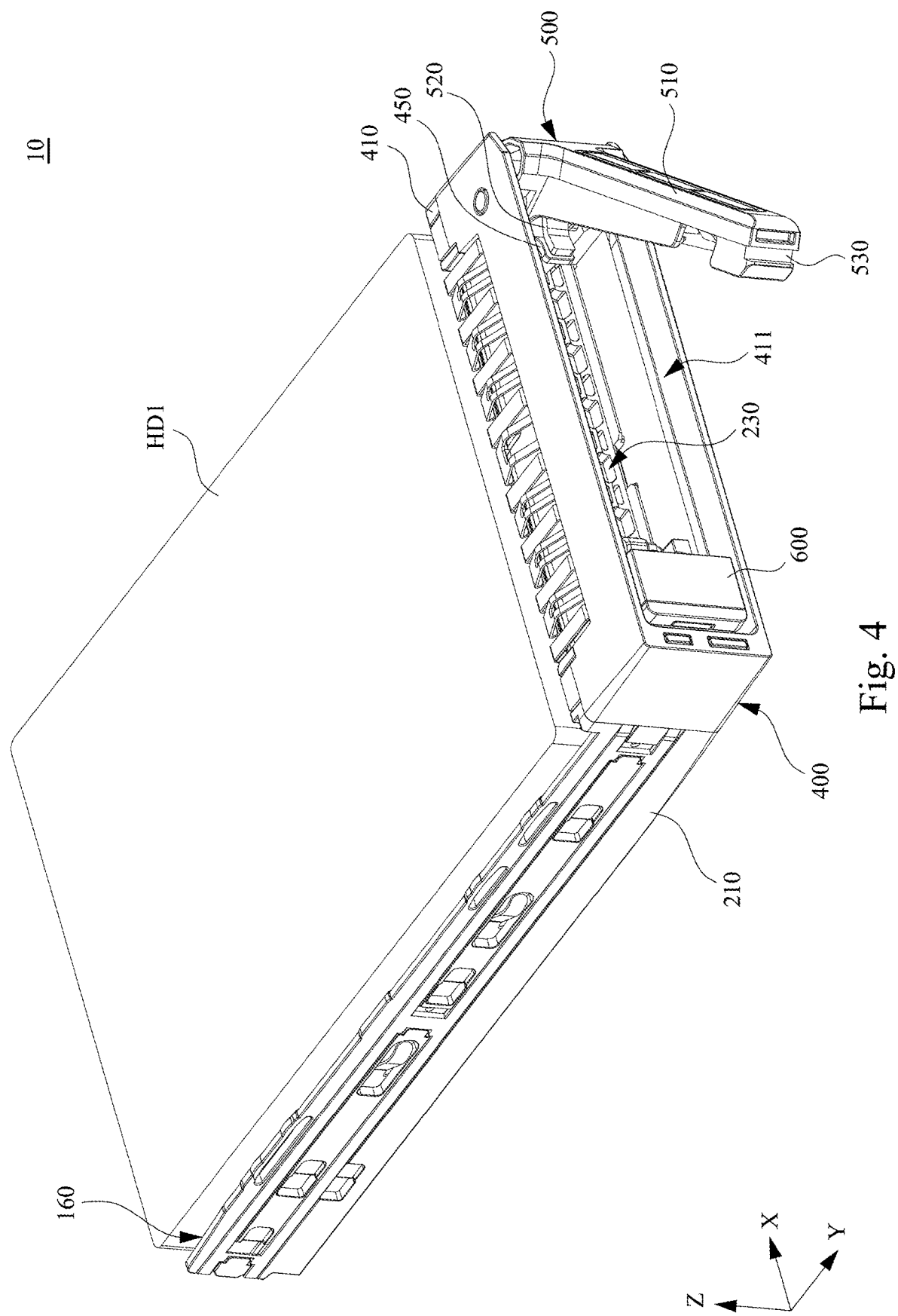
FIG. 4 is an operational schematic view of the hard disk tray loading a first hard disk in FIG. 1.
Figure 5:
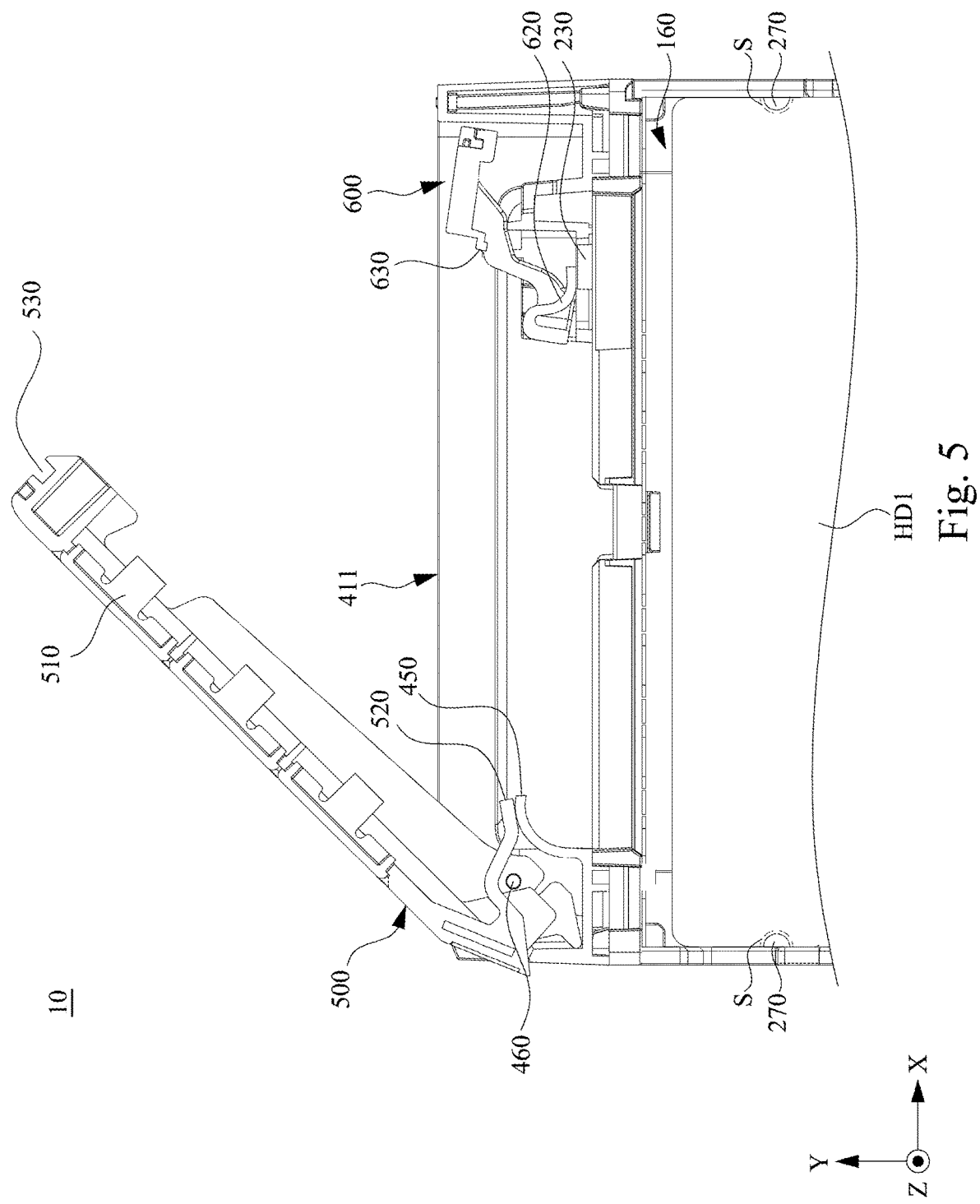
FIG. 5 is an usage state view of the hard disk tray in FIG. 3.

FIG. 4 is an operational schematic view of the hard disk tray 10 loading a first hard disk HD1 in FIG. 1. FIG. 5 is an usage state view of the hard disk tray 10 in FIG. 3. As shown in FIG. 4 and FIG. 5, when the hard disk tray 10 is needed to be drawn out of the server chassis (not shown in figures), at first, the buckle 600 is pressed down, so that the buckle 600 is rotated away from the bracket 510 and the second fastening portion 630 is disengaged from the first fastening portion 530, the bracket 510 can be rotated away from the buckle 600 by the first restoring elastic force of the first elastic arm 520 and the first restoring elastic force of the abutting elastic arm 450 at the same time, thus, the hard disk tray 10 can be drawn out of the server chassis (not shown in figures) through the bracket 510. It is noted, when the bracket 510 is rotated out of the hollow passage 411, since the first elastic arm 520 is still pushed against by the abutting elastic arm 450, the bracket 510 can be fixedly held outside the hollow passage 411, so that the bracket 510 will not be shaken arbitrarily on the base body 410.

At the same time, as shown in FIG. 5, since the buckle 600 is movable with the second elastic arm 620, the second elastic arm 620 is pressed against and curved inwardly by the abutment member 230, so that the second elastic arm 620 being deformed stores a second restoring elastic force. On the contrary, as shown in FIG. 3, when the buckle 600 is no longer pulled, the second restoring elastic force of the second elastic arm 620 allows the buckle 600 to rotate back to its original position. It is noted, when the buckle 600 is rotated back to its original state (i.e., the force balance state), as shown in FIG. 3, since the second elastic arm 620 has been preloaded to store elastic potential energy, therefore, not only makes the buckle 600 to have stronger rebound resilience, but also provides a rebound hand feeling for the operator.

Thus, since the first elastic arm 520 is integrally formed on the handle 500, and the second elastic arm 620 is integrally formed on the buckle 600, in order to facilitate the assembly process of the hard disk tray 10 to be imported into the automation equipment of the production line, the operator is not necessary to adopt elastic metals (e.g., springs, torsions or elastic pieces) to be the resilience workpieces of the handle 500 and the buckle 600. The robotic arm of the automation equipment of the production line only needs to press the handle 500 or the buckle 600 into the base frame 400 so that the first elastic arm 520 can be placed to abut against the abutting elastic arm 450 and the second elastic arm 620 can be placed to abut against the abutment member 230, thus, not necessary to be done manually. Thus, it is beneficial to fulfill the goal of a fully automated production line so as to effectively reduce the number of parts used in the hard disk tray 10.

As shown in FIG. 1 and FIG. 2, more specifically, the first frame body 110 includes a front component 120 and a rear component 150. The front component 120 and the rear component 150 are fixed to each other so as to collectively form the aforementioned loading space 160. For example, the front component 120 includes an EMI frame 130 and two first lateral plates 140. The first lateral plates 140 are arranged opposite to each other, and the EMI frame 130 is integrally disposed between the first lateral plates 140. The rear component 150 and the EMI frame 130 are arranged opposite to each other, and fixedly connected to the first lateral plates 140. For example, the front component 120 and the rear component 150 are respectively made of metal materials. Thus, since the front component 120 and the rear component 150 are fixed together after the front component 120 and the rear component 150 are formed separately, a single workpiece is not needed to be cut and bended to form an integral frame, which can reduce excess and waste material, thereby reducing material costs.

As shown in FIG. 2 and FIG. 4, the EMI frame 130 of the first frame body 110 is provided with a first mesh structure 131 and a clamping structure 133. The clamping structure 133 is disposed on the first mesh structure 131 and clamped on the second frame body 210 and base body 410. The first mesh structure 131 is formed with a plurality of first mesh holes 132 which are evenly distributed thereon. Each of the first mesh holes 132 is in a geometric shape (e.g., regular hexagonal opening). However, the disclosure is not limited to the shape of the mesh holes, in other embodiment, the shape of each of the first mesh holes 132 may also be in an elongated geometric shape (e.g., elongated hexagonal mesh hole). The EMI frame 130 is used to eliminate or reduce electromagnetic interference.

The second frame body 210 is provided with a second mesh structure 231 and two second lateral plates 240. The second lateral plates 240 are arranged opposite to each other, and each of the second lateral plates 240 is coupled to the corresponding one of the first lateral plates 140. The second mesh structure 231 is integrally disposed between the second lateral plates 240, and the second mesh structure 231 is sandwiched between the hollow passage 411 and the first mesh structure 131. The hollow passage 411 is in communication with the loading space 160 through the second mesh structure 231 and the first mesh structure 131. The second mesh structure 231 is formed with a plurality of second mesh holes 232 which are evenly distributed thereon. A shape of each of the second mesh holes 232 is the same as a shape of each of the first mesh holes 132. However, the disclosure is not limited thereto. Each of the first lateral plates 140 is provided with a flange 141 which protrudes in a direction (e.g., Z axis) towards the loading space 160.

Furthermore, as shown in FIG. 1 and FIG. 2, the loading frame 100 further includes a first assembly hole 250, a second assembly hole 260, a plurality (e.g., three) of positioning bumps 270 and a fixing member 300. The first assembly hole 250 and the second assembly hole 260 are formed on the same side of the second frame body 210, and the first assembly hole 250 and the second assembly hole 260 are spaced arranged thereon. The first assembly hole 250 and the second assembly hole 260 are respectively aligned with two of the first openings 170 on the same side of the loading frame 100. The first assembly hole 250 and the second assembly hole 260 are in communication with the loading space 160 through the corresponding one of the first openings 170, respectively. The fixing member 300 is detachably received within the first assembly hole 250, and extends into the loading space 160 through the first assembly hole 250 and the corresponding one of the first openings 170. In this embodiment, the fixing member 300 is not a metal stud, and is able to be quickly removed from the first assembly hole 250. The positioning bumps 270 are respectively arranged on two opposite sides of the second frame body 210, and respectively extend into the loading space 160 through the remaining three of the first openings 170.

Thus, when a hard disk device (e.g., first hard disk HD1) is located within the loading space 160, and placed on the rear component 150 and these flanges 141 of the first frame body 110, the fixing member 300 and these positioning bumps 270 can collectively hold the hard disk device (e.g., first hard disk HD1) located within the loading space 160, that is, the fixing member 300 and these positioning bumps 270 respectively press against several screw holes S on both sides of the hard disk device (e.g., first hard disk HD1), so that the hard disk device (e.g., first hard disk HD1) can be clamped therebetween. The aforementioned first hard disk HD1 is a hard disk device with a first specification (e.g., 3.5 inches).

In this embodiment, these positioning bumps 270 are not studs, and these positioning bumps 270 are integrally formed on the second frame body 210, and respectively extend from two opposite inner surfaces 211 of the second frame body 210 facing towards the receiving space 220, however, the disclosure is not limited thereto.

In the embodiment, the hardness of these positioning bumps 270 and the hardness of the fixing member 300 are respectively less than the hardness of the first hard disk HD1. In this way, when each of the second frame body 210, the positioning bumps 270 and the fixing member 300 includes material with a hardness lower than that of metal (e.g., plastic or rubber), that is, the hardness of each of the second frame body 210, the positioning bumps 270 and the fixing member 300 is less than the hardness of a housing of the first hard disk HD1 so that the positioning bumps 270 and the fixing members 300 are unable to scratch the first hard disk HD1.

Figure 6A:
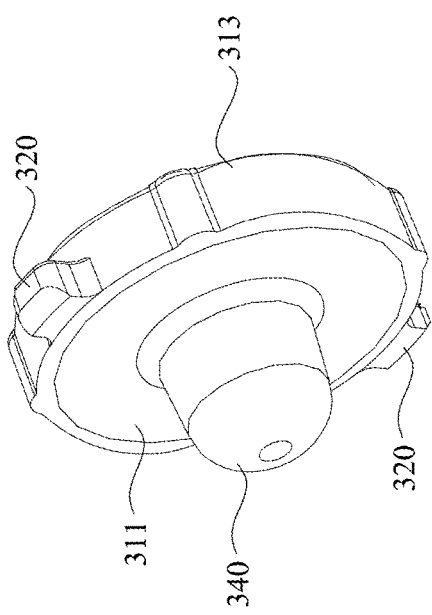
FIG. 6A is a partial enlarged view of the fixing member in FIG. 2.
Figure 6B:
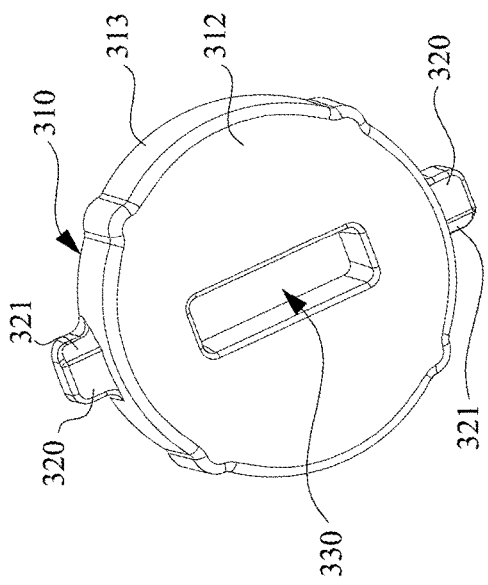
FIG. 6B is a perspective view of the fixing member viewed in another direction.

FIG. 6A is a partial enlarged view of the fixing member 300 in FIG. 2, and FIG. 6B is a perspective view of the fixing member 300 viewed in another direction. As shown in FIG. 6A and FIG. 6B, the fixing member 300 includes a fixing body 310, two protrusive ribs 320, an indentation 330 and a protrusive pole 340. The protrusive pole 340 is disposed on the fixing body 310, and extends into the loading space 160 through the second assembly hole 260. The protrusive ribs 320 are disposed on the fixing body 310. In the embodiment, the fixing body 310 is in a disk shape, and the fixing body 310 includes a front surface 311, a back surface 312 and at least one side surface (e.g., circumferential surface 313). The front surface 311 and the back surface 312 are opposite to each other, and the circumferential surface 313 is adjacent to both of the front surface 311 and the back surface 312, and surrounds the front surface 311 and the back surface 312, respectively. The protrusive pole 340 is protruded from the front surface 311 of the fixing body 310, and used to extend to the first hard disk HD1 through the first assembly hole 250 and the corresponding one of the first openings 170 described above. The indentation 330 is formed on the back surface 312 of the fixing body 310 so that a tool can rotate the fixing member 300 using the indentation 330. The protrusive ribs 320 radially protrude from the circumferential surface 313 of the fixing body 310, respectively. One side of each of the protrusive ribs 320 is provided with a first guiding slope 321.

Figure 7:
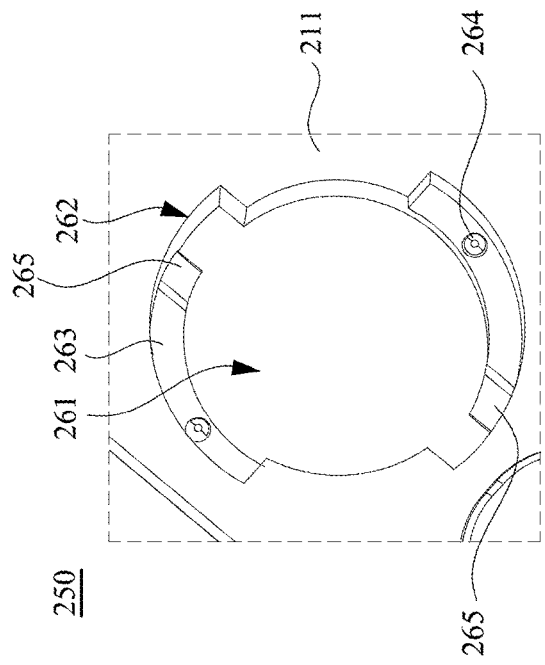
FIG. 7 is a perspective view of a first assembly hole in FIG. 2.

FIG. 7 is a perspective view of a first assembly hole 250 in FIG. 2. As shown in FIG. 6A to FIG. 7, the first assembly hole 250 includes a through hole 261, two inlet portions 262 and two arc grooves 263. The through hole 261 and the inlet portions 262 commonly penetrate through the second frame body 210. The through hole 261 is located between the inlet portions 262 described above, and between the arc grooves 263 described above. Each of the arc grooves 263 is concavely formed on the aforementioned inner surface 211 of the second frame body 210 and connected to the through hole 261 and the corresponding inlet portion 262. More specifically, a bottom surface of each of the arc grooves 263 is planar, and one end of each of the arc grooves 263 is provided with a second guiding slope 265 connected to the corresponding inlet portion 262. Moreover, each of the arc groove 263 is further provided with a limiting protrusion 264. Therefore, when the fixing body 310 enters into the through hole 261, and the protrusive ribs 320 respectively enter the corresponding one of the inlet portions 262, and the fixing body 310 is then rotated by rotating the indentation 330, by the first guiding slope 321 of each of the protrusive ribs 320 attached to the second guiding slope 265 of each of the arc grooves 263, each of the protrusive ribs 320 can be rotated into the arc groove 263 through the corresponding inlet portion 262, and the fixing member 300 is positioned between the second frame body 210 and the first frame body 110. In addition, the limiting protrusion 264 in each of the arc groove 263 can further improve the position-limiting strength of the fixing member 300. It is noted, the above-mentioned design of the first assembly hole 250 is also applied to the second assembly hole 260.

Figure 8:
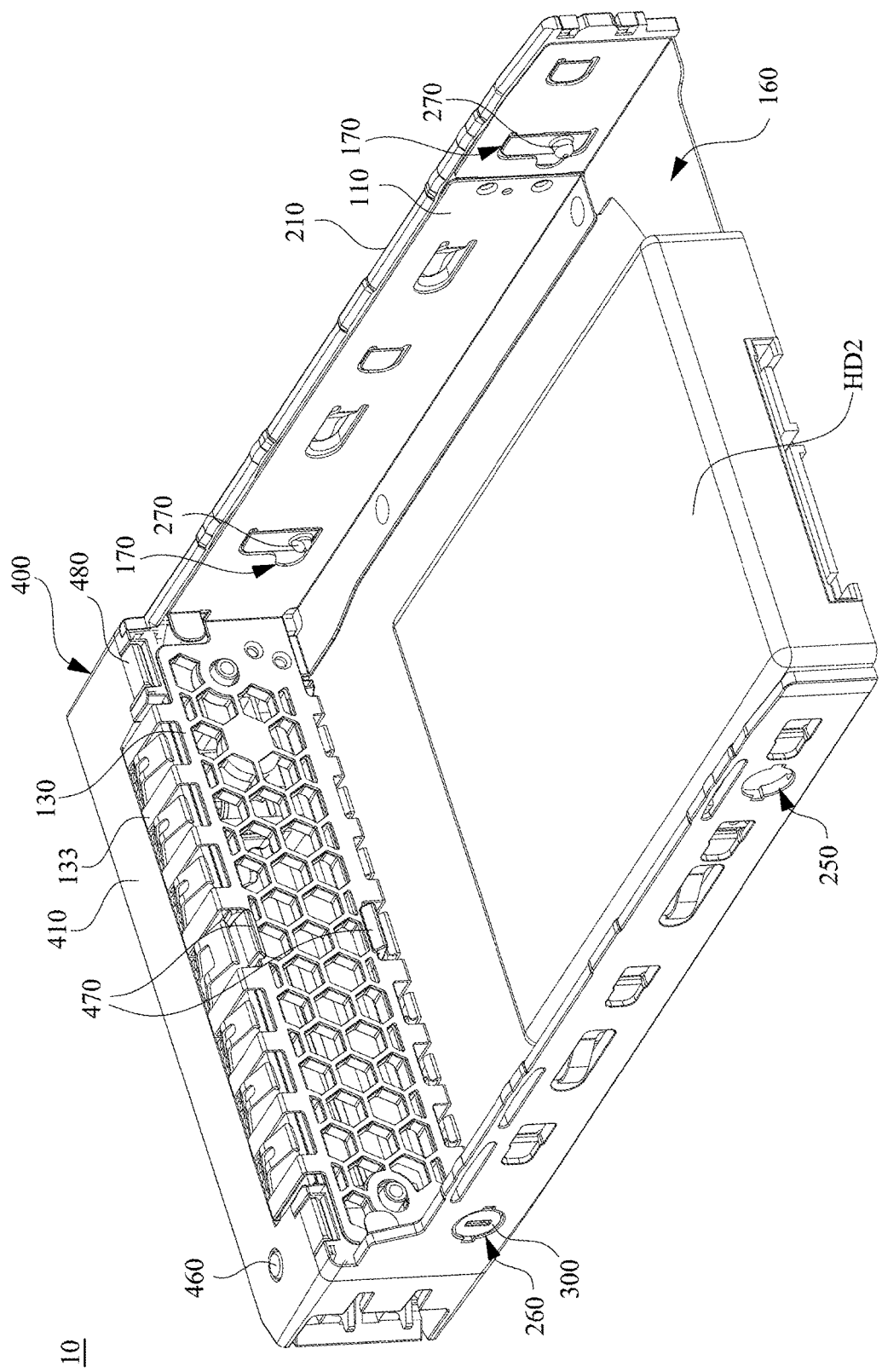
FIG. 8 is an operational schematic view of the hard disk tray loading a second hard disk in FIG. 1.

FIG. 8 is an operational schematic view of the hard disk tray 10 loading a second hard disk HD2 in FIG. 1. As shown in FIG. 2 and FIG. 8, the first frame body 110 further includes a plurality of second openings 180. The second openings 180 are formed on one of the flanges 141 and the rear component 150, and used to fix the hard disk device (e.g., second hard disk HD2) in the loading space 160 through the bolts BT, respectively. The hard disk device (e.g., second hard disk HD2) covers the first assembly hole 250. The second hard disk HD2 is a hard disk device with a second specification (e.g., 2.5 inches).

It is noted, as the second hard disk HD2 is to be loaded, after the fixing member 300 is completely removed from the first assembly hole 250, the fixing member 300 can be selectively moved into the second assembly hole 260, thereby providing a way for storing the fixing member 300, and not losing the fixing member 300; then, the second hard disk HD2 can be fixed on the loading frame 100 by locking the bolts BT (FIG. 2) to the second openings 180, respectively. In this way, the hard disk tray 10 of this embodiment can be compatible with any hard disk device having different sizes (e.g., the first hard disk HD1 and the second hard disk HD2).

As shown in FIG. 2 and FIG. 8, the base frame 400 further includes a plurality of first hook portions 470 and a plurality of second hook portions 480. The first hooking portions 470 are symmetrically disposed on the base body 410, and detachably coupled to the first frame body 110. The second hook portions 480 are symmetrically disposed on the EMI frame 130 of the base body 410, and detachably coupled to the second mesh structure 231 of the second frame body 210. Thus, when the base frame 400 is assembled with the loading frame 100, the robot arm (not shown in the figures) in the production line automation equipment only needs to engage the first hook portions 470 of the base frame 400 with the first frame body 110, and engage the second hook portions 480 with the second frame body 210 so that the second frame body 210 is sandwiched between the first frame body 110 and the base body 410.

In addition, as shown in FIG. 1 and FIG. 2, two opposite sides of the hard disk tray 10 have different heights H1, H2. More specifically, the first lateral plates 140 of the front component 120 have different heights H1, H2. In this way, when the hard disk tray 10 is moved into a server chassis (not shown in figures), since the opposite sides of the hard disk tray 10 having different heights H1, H2 can provide a fool-proof mechanism so that a user will not misplace the hard disk tray 10 to move into the server chassis upside down.

Figure 9:
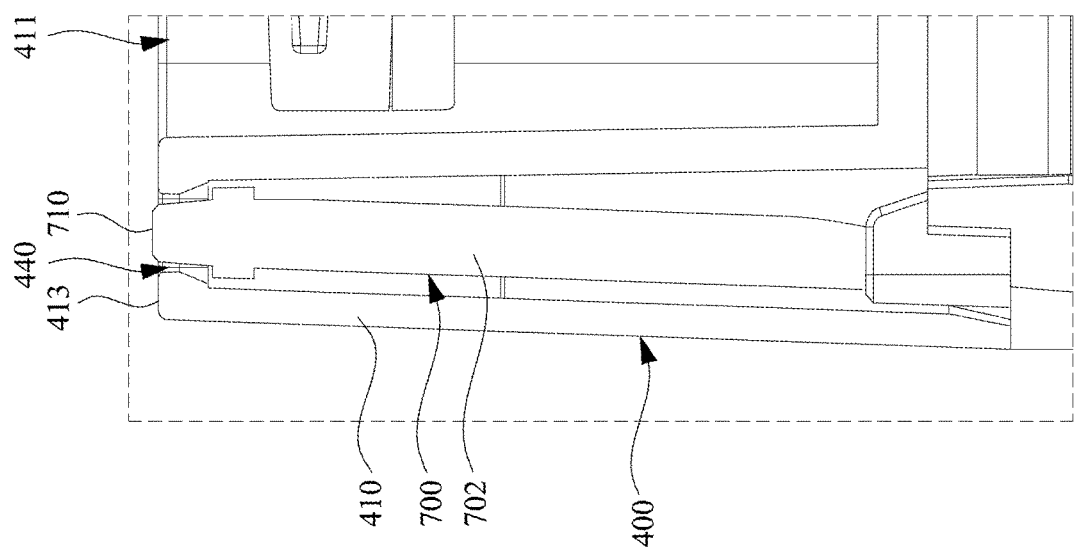
FIG. 9 is a cross-sectional view of the hard disk tray viewed along a line BB of FIG. 1.

FIG. 9 is a cross-sectional view of the hard disk tray 10 viewed along a line BB of FIG. 1. As shown in FIG. 2 and FIG. 9, the base frame 400 is formed with one or more penetrating channels 440. The penetrating channels 440 are commonly arranged on one side of the hollow passage 411 of the base frame 400. Each of the penetrating channels 440 penetrates through the base body 410, and a long axis direction of each of the penetrating channels 440 is the same as a long axis direction of the hard disk tray 10 (e.g., Y axis). The hard disk tray 10 further includes a light guide element 700. One end of the light guide element 700 is used to connect to a light source (not shown in figures), and the other end of the light guide element 700 is provided with at least one light outputting portion 710 at one distal end thereon. One part 701 of the light guide element 700 is located on an outer surface 212 of the second frame body 210 facing away from the loading space 160, and another part 702 of the light guide element 700 is in the penetrating channel 440. The light outputting portion 710 of the light guide element 700 protrudes outwards from a surface 413 of the base frame 400 through the penetrating channel 440. In the embodiment, the distal end of the other end of the light guide element 700 is provided with two light outputting portions 710. The light outputting portions 710 are spaced apart from each other, and the light outputting portions 710 have different areas so that the light outputting portions 710 is able to present two light outputting surfaces with different areas at the surface 413 of the base frame 400 so as to assist a user to quickly identify different light signals emitted by the light outputting portions 710. For example, as shown in FIG. 1, when a hard disk loaded on the hard disk tray 10 is powered on to be operated ordinarily, the above-mentioned light source (not shown in figures) makes one of the light outputting portions 710 with a smaller area to emit blue rays; when the hard disk fails, the above-mentioned light source (not shown in figures) makes the other of the light outputting portions 710 with a larger area to emit a malfunction or warning light signal (e.g., a red/green ray).

Thus, since each of the light outputting portions 710 of the light guide element 700 protrudes outwards from the surface 413 of the base frame 400, more light emitting angles thereof are provided, so that personals who are not exactly facing the penetrating channel 440 also can observe the light signal from the light outputting portions 710.

Figure 10:
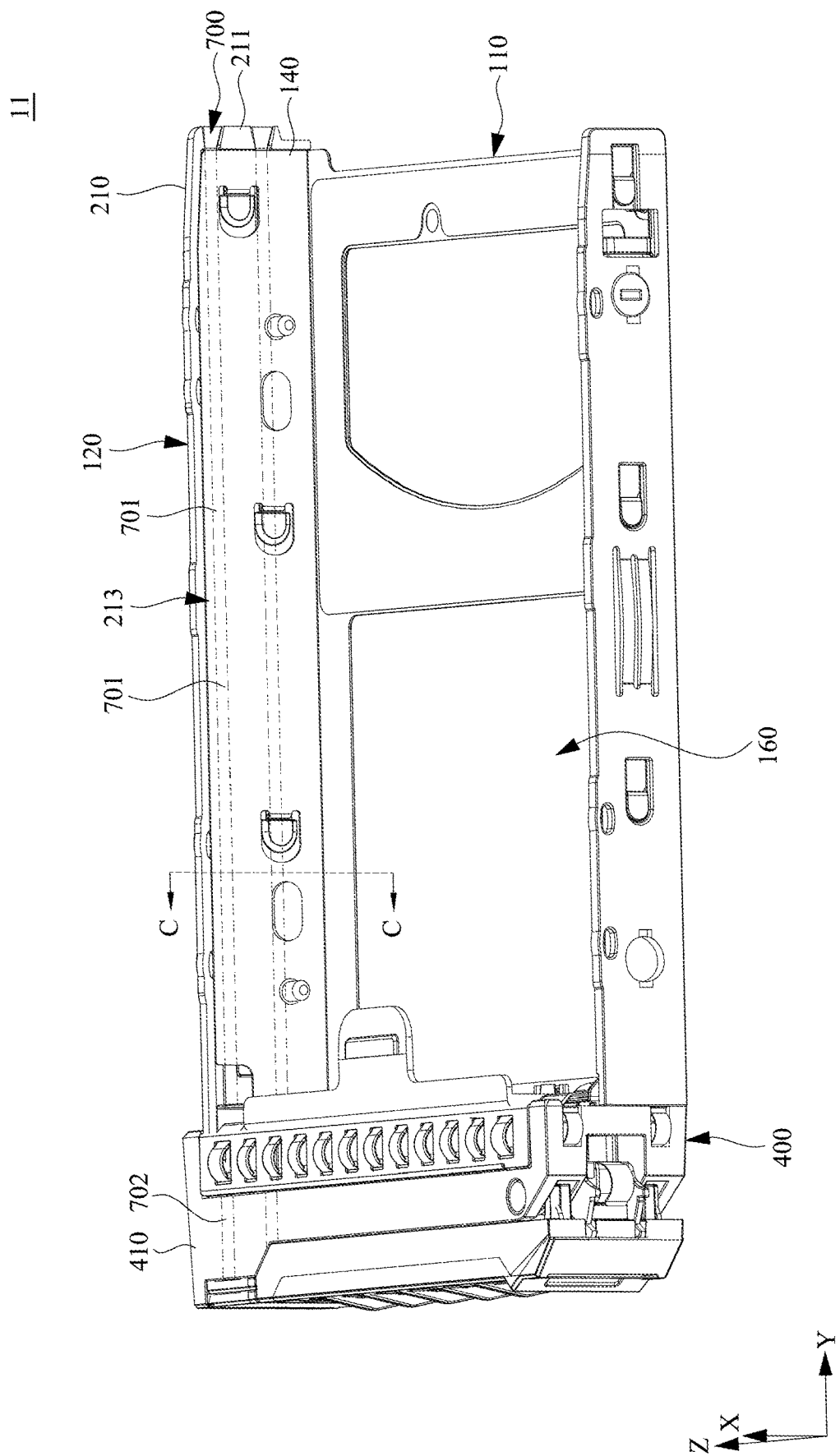
FIG. 10 is a perspective view of a hard disk tray according to one embodiment of the present disclosure.
Figure 11:
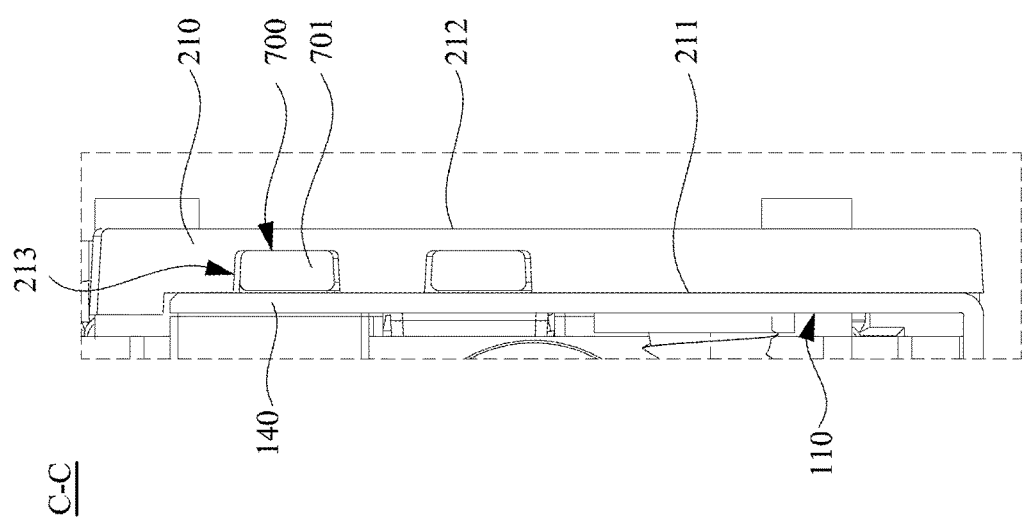
FIG. 11 is a cross-sectional view of the hard disk tray viewed along a line CC of FIG. 10.

FIG. 10 is a perspective view of a hard disk tray 11 according to one embodiment of the present disclosure. FIG. 11 is a cross-sectional view of the hard disk tray 11 viewed along a line CC of FIG. 10. As shown in FIG. 10 and FIG. 11, the hard disk tray 11 of the present embodiment is substantially the same as the hard disk tray 10 of the above-mentioned embodiment, except that the aforementioned part 701 of the light guide element 700 is located on an inner side (e.g., inner surface 211) of the second frame body 210 facing towards the loading space 160.

More specifically, in the embodiment, the inner surface 211 of the second frame body 210 facing towards the loading space 160 is formed with at least one strip groove 213. The strip groove 213 extends longitudinally in a direction (refer to Y axis) from approaching the base frame 400 to depart from the base frame 400. The aforementioned part 701 of the light guide element 700 is located within the strip groove 213. The first lateral plate 140 covers the second frame body 210 and the strip groove 213 so that the light guide element 700 is sandwiched between the first lateral plate 140 of the first frame body 110 and the second frame body 210. However, the disclosure is not limited thereto, in other embodiments, the light outputting portion 710 of the light guide element 700 may also be received within the penetrating channel 440, and not protrude outwards from the surface 413 of the base frame 400.

It is noted, when the light guide element 700 is not installed yet, the strip groove 213 and the penetrating channel 440 may also form an integral air channel together, which helps air flows to pass through the hard disk tray 11 via the integral air channel.

Figure 12:
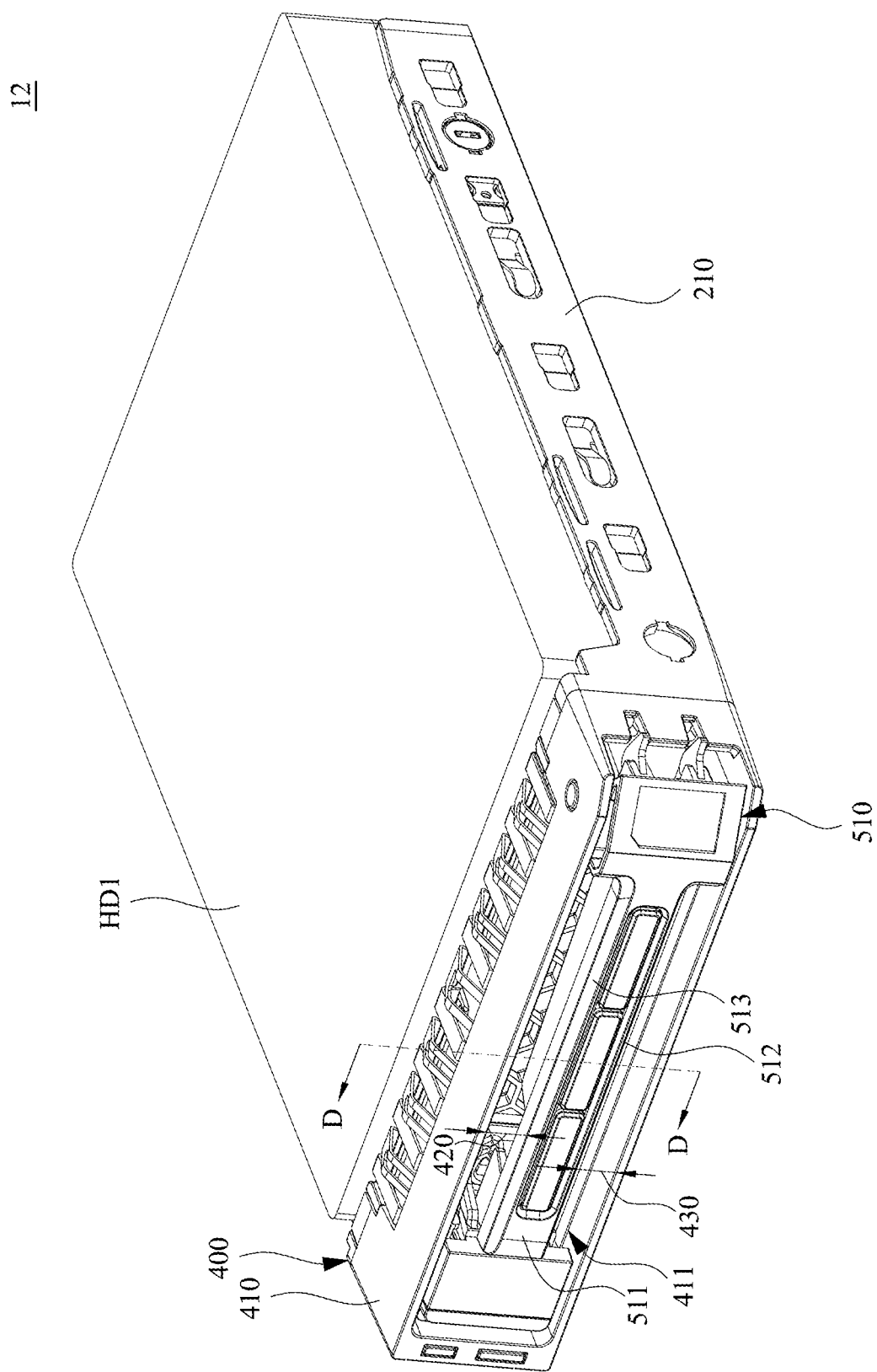
FIG. 12 is a perspective view of a hard disk tray according to one embodiment of the present disclosure.
Figure 13:
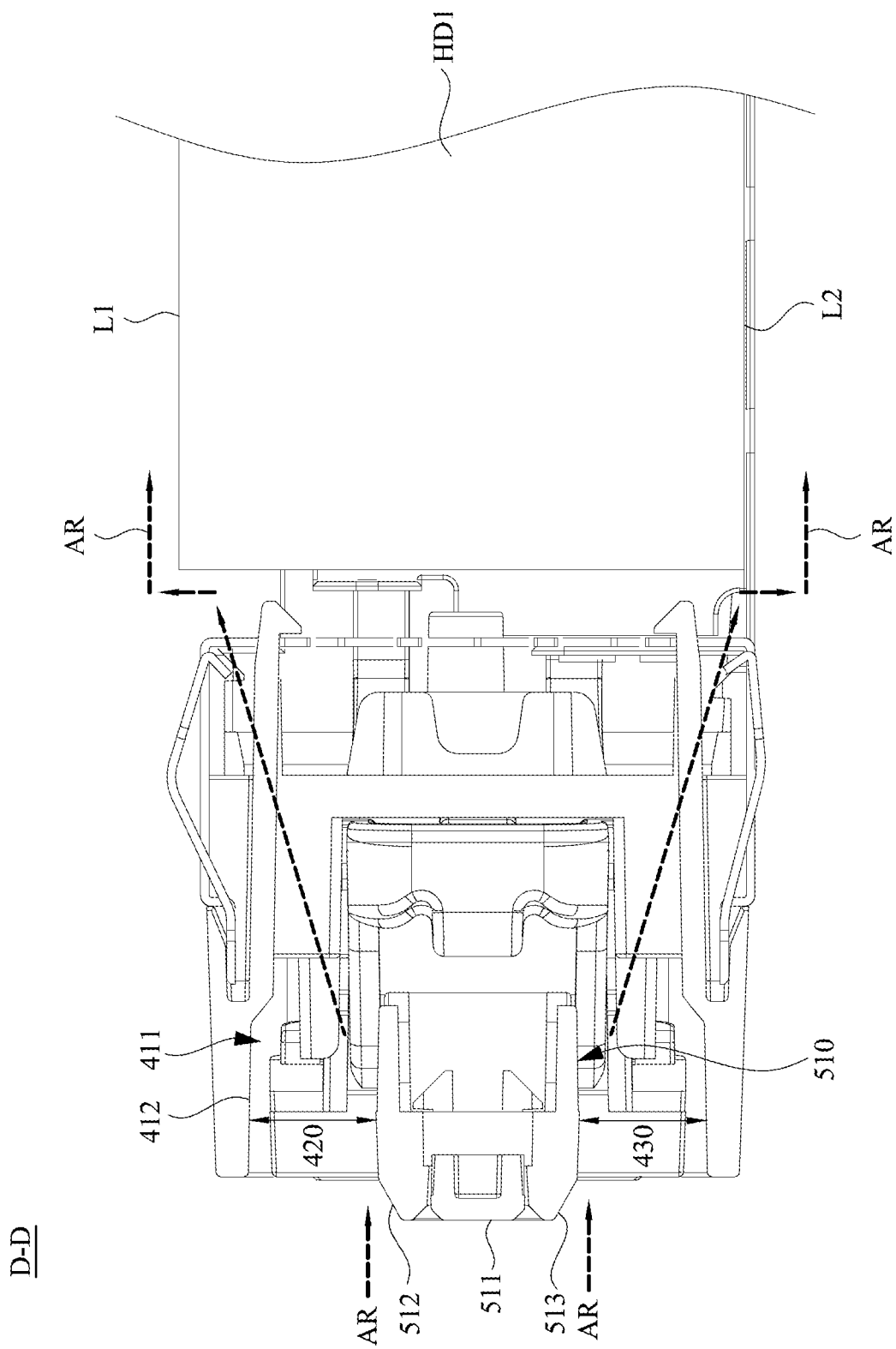
FIG. 13 is a cross-sectional view of the hard disk tray viewed along a line DD of FIG. 12.

FIG. 12 is a perspective view of a hard disk tray 12 according to one embodiment of the present disclosure. FIG. 13 is a cross-sectional view of the hard disk tray 12 viewed along a line DD of FIG. 12. As shown in FIG. 12 and FIG. 13, one side of the bracket 510 facing away from the loading frame 100 is provided with a front-end portion 511, an upper guiding slope surface 512 and a lower guiding slope surface 513. The front-end portion 511 is connected to the upper guiding slope surface 512 and the lower guiding slope surface 513, and disposed between the upper guiding slope surface 512 and the lower guiding slope surface 513. The upper guiding slope surface 512 and the lower guiding slope surface 513 are respectively connected to two opposite sides of the front-end portion 511, and gradually extend away from each other in a direction facing away from the front-end portion 511.

Thus, when the bracket 510 is placed in the hollow passage 411, the bracket 510 and inner walls 412 of the hollow passage 411 respectively define an upper gap 420 and a lower gap 430, and the upper guiding slope surface 512 and the lower guiding slope surface 513 are used to guide incoming air flows AR to two opposite surfaces L1, L2 of the hard disk device (e.g., first hard disk HD1) through the upper gap 420 and the lower gap 430.

Thus, compared to the incoming air flows AR reach the hard disk device (e.g., first hard disk HD1) laterally, it will be shunted to the two opposite sides L1, L2 of the hard disk device (such as the first hard disk HD1), the bracket of the present embodiment The upper guiding slope surface 512 and the lower guiding slope surface 513 of the 510 can divert the incoming airflow AR to the two opposite sides L1 and L2 of the hard disk device (such as the first hard disk HD1) to accelerate the airflow velocity and performance, thereby improving the overall heat dissipation performance.

Thus, through the construction of the embodiments above, these components mentioned above of the hard disk tray in the disclosure are able to be grasped by a robot arm, deformed by exerting force, so as to be finally assembled as the hard disk tray mentioned above, and not necessary to be done manually. Thus, it is beneficial to fulfill the goal of a fully automated production line.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A hard disk tray conducive to automated productions, comprising:
   a loading frame comprising a first frame body formed with a loading space for loading a hard disk device therein;
   a base frame comprising a base body connected to the first frame body, and an abutting elastic arm integrally connected to the base body;
   an abutment member disposed within the base body;
   a handle comprising a bracket pivotally connected to the base body, a first elastic arm integrally connected to the bracket to abut against the abutting elastic arm, and a first fastening portion disposed on the bracket; and
   a buckle comprising a buckle body pivotally connected to the base body and arranged opposite to the handle, a second elastic arm integrally connected to the buckle body to abut against the abutment member, and a second fastening portion disposed on the buckle body for fastening to the first fastening portion.

2. The hard disk tray conducive to automated productions of claim 1, wherein the loading frame further comprises:
   a plurality of openings respectively arranged on two opposite sides of the first frame body;
   a second frame body formed with a receiving space for receiving the first frame body, and the second frame body that is sleeved to outer sides of the first frame body facing away from the receiving space, disposed between the first frame body and the base body, and integrally connected to the abutment member;
   at least one assembly hole formed on one side of the second frame body;
   a fixing member detachably received within the at least one assembly hole, and extending into the loading space from the at least one assembly hole; and
   a plurality of positioning bumps respectively arranged on two opposite inner surfaces of the second frame body facing towards the receiving space, and respectively extending into the loading space through some of the openings,
   wherein the fixing member and the positioning bumps collectively hold the hard disk device within the loading space.

3. The hard disk tray conducive to automated productions of claim 2, wherein the first frame body comprises:
   a front component comprising two lateral plates and an EMI frame connected to the lateral plates and sandwiched between the second frame body and the base frame; and
   a rear component that is opposite to the EMI frame and fixedly connected to the lateral plates.

4. The hard disk tray conducive to automated productions of claim 3, wherein the lateral plates of the front component have different heights.

5. The hard disk tray conducive to automated productions of claim 2, wherein the base frame further comprises at least one first hook portion and at least one second hook portion, the at least one first hook portion that is disposed on the base body and detachably coupled to the first frame body, and the at least one second hook portion that is disposed on the base body and detachably coupled to the second frame body.

6. The hard disk tray conducive to automated productions of claim 2, wherein the at least one assembly hole comprises a through hole, at least one inlet portion and at least one arc groove, the through hole and the at least one inlet portion commonly penetrate through the second frame body, the at least one arc groove is concavely formed on one of the opposite inner surfaces of the second frame body and connected to the at least one inlet portion; and
   the fixing member comprises a fixing body, at least one protrusive rib and at least one protrusive pole, the at least one protrusive pole is disposed on a front surface of the fixing body and extends to the hard disk device within the loading space through the at least one assembly hole, and the protrusive rib is located on one side surface of the fixing body and used to be rotated into the at least one arc groove from the at least one inlet portion, so that the fixing member is able to be positioned between the second frame body and the first frame body.

7. The hard disk tray conducive to automated productions of claim 2, further comprising:
   a light guide element formed with at least one light outputting portion at one distal end thereon, wherein the base frame is formed with at least one penetrating channel penetrating through the base body,
   one part of the light guide element is located on one of an outer surface and an inner side of the second frame body, and another part of the light guide element is in the at least one penetrating channel, and the at least one light outputting portion of the light guide element extends outwardly from a surface of the base frame through the at least one penetrating channel.

8. The hard disk tray conducive to automated productions of claim 7, wherein the at least one light outputting portion comprises a plurality of the light outputting portions spaced apart from one another, and the light outputting portions have different areas.

9. The hard disk tray conducive to automated productions of claim 2, wherein the base frame comprises a hollow passage, the first frame body is provided with a first mesh structure, and the second frame body is provided with a second mesh structure sandwiched between the hollow passage and the first mesh structure, and the hollow passage is in communication with the loading space through the second mesh structure and the first mesh structure.

10. The hard disk tray conducive to automated productions of claim 9, wherein the first mesh structure is formed with a plurality of first mesh holes which are evenly distributed thereon, and each of the first mesh holes is in one of a geometric shape and an elongated shape; and the second mesh structure is formed with a plurality of second mesh holes which are evenly distributed thereon, and a shape of each of the second mesh holes is the same as a shape of each of the first mesh holes.

11. The hard disk tray conducive to automated productions of claim 9, wherein one side of the bracket facing away from the loading frame is provided with a front-end portion, an upper guiding slope surface and a lower guiding slope surface, the upper guiding slope surface and the lower guiding slope surface are respectively connected to two opposite sides of the front-end portion, and gradually extend away from each other in a direction facing away from the front-end portion, wherein when the bracket is placed in the hollow passage, the bracket and inner walls of the hollow passage respectively define an upper gap and a lower gap, and the upper guiding slope surface and the lower guiding slope surface are used to guide incoming air flows to two opposite surfaces of the hard disk device through the upper gap and the lower gap.

12. A hard disk tray conducive to automated productions, comprising:

a loading frame comprising a first frame body that is formed with a loading space for loading a hard disk device therein, and an abutment member connected to the first frame body, wherein two opposite sides of the first frame body have different heights, respectively;

a base frame comprising a base body connected to the first frame body, and an abutting elastic arm integrally connected to the base body;

a handle comprising a bracket pivotally connected to the base body, a first elastic arm integrally connected to the bracket to abut against the abutting elastic arm, and a first fastening portion disposed on the bracket; and a buckle comprising a buckle body pivotally connected to the base body and arranged opposite to the handle, a second elastic arm integrally connected to the buckle body to abut against the abutment member, and a second fastening portion disposed on the buckle body for fastening to the first fastening portion.

13. The hard disk tray conducive to automated productions of claim 12, wherein the loading frame further comprises:

a plurality of openings respectively arranged on the opposite sides of the first frame body;

a second frame body formed with a receiving space for receiving the first frame body, the second frame body sleeved to outer sides of the first frame body facing away from the receiving space, disposed between the first frame body and the base body, wherein the abutment member is integrally protruded on the second frame body;

at least one assembly hole formed on one side of the second frame body;

a fixing member detachably received within the at least one assembly hole, and extending into the loading space from the at least one assembly hole; and a plurality of positioning bumps respectively arranged on two opposite inner surfaces of the second frame body facing towards the receiving space, and respectively extending into the loading space through some of the openings, wherein the fixing member and the positioning bumps collectively hold the hard disk device within the loading space.

14. The hard disk tray conducive to automated productions of claim 13, wherein the first frame body comprises:

a front component comprising an EMI frame and two lateral plates, the EMI frame that is connected to the lateral plates and sandwiched between the second frame body and the base frame; and a rear component opposite to the EMI frame, and fixedly connected to the lateral plates.

15. The hard disk tray conducive to automated productions of claim 13, wherein the base frame further comprises at least one first hook portion disposed on the base body and detachably coupled to the first frame body, and at least one second hook portion disposed on the base body and detachably coupled to the second frame body.

16. The hard disk tray conducive to automated productions of claim 13, wherein the at least one assembly hole comprises a through hole, at least one inlet portion and at least one arc groove, the through hole and the at least one inlet portion commonly penetrate through the second frame body, the at least one arc groove is concavely formed on one of the opposite inner surfaces of the second frame body and connected to the at least one inlet portion; and the fixing member comprises a fixing body, at least one protrusive rib and at least one protrusive pole, the at least one protrusive pole is disposed on a front surface of the fixing body and extends to the hard disk device within the loading space through the at least one assembly hole, and the protrusive rib is located on one side surface of the fixing body, and used to be rotated into the at least one arc groove from the at least one inlet portion, so that the fixing member is able to be positioned between the second frame body and the first frame body.

17. The hard disk tray conducive to automated productions of claim 13, further comprising:

a light guide element formed with at least one light outputting portion at one distal end thereon, wherein the base frame is formed with at least one penetrating channel penetrating through the base body, one part of the light guide element is located on one of an outer surface and an inner side of the second frame body, and another part of the light guide element is in the at least one penetrating channel, and the at least one light outputting portion of the light guide element extends outwardly from a surface of the base frame through the at least one penetrating channel.

18. The hard disk tray conducive to automated productions of claim 17, wherein the at least one light outputting portion comprises a plurality of the light outputting portions spaced apart from one another, and the light outputting portions have different areas.

19. The hard disk tray conducive to automated productions of claim 13, wherein the base frame comprises a hollow passage, the first frame body is provided with a first mesh structure, and the second frame body is provided with a second mesh structure sandwiched between the hollow passage and the first mesh structure, and the hollow passage is in communication with the loading space through the second mesh structure and the first mesh structure, wherein the first mesh structure is formed with a plurality of first mesh holes which are evenly distributed thereon, and each of the first mesh holes is in one of a geometric shape and an elongated shape and the second mesh structure is formed with a plurality of second mesh holes which are evenly distributed thereon, and a shape of each of the second mesh holes is the same as a shape of each of the first mesh holes.

20. The hard disk tray conducive to automated productions of claim 19, wherein one side of the bracket facing away from the loading frame is provided with a front-end portion, an upper guiding slope surface and a lower guiding slope surface, the upper guiding slope surface and the lower guiding slope surface are respectively connected to two opposite sides of the front-end portion, and gradually extend away from each other in a direction facing away from the front-end portion, wherein when the bracket is placed in the hollow passage, the bracket and inner walls of the hollow passage respectively define an upper gap and a lower gap, and the upper guiding slope surface and the lower guiding slope surface are used to guide incoming air flows to two opposite surfaces of the hard disk device through the upper gap and the lower gap.

* * * * *